United States Patent
Morii

(10) Patent No.: US 11,545,954 B2
(45) Date of Patent: Jan. 3, 2023

(54) IMPEDANCE ADJUSTMENT DEVICE

(71) Applicant: DAIHEN Corporation, Osaka (JP)

(72) Inventor: Tatsuya Morii, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 17/123,645

(22) Filed: Dec. 16, 2020

(65) Prior Publication Data

US 2021/0203301 A1 Jul. 1, 2021

(30) Foreign Application Priority Data

Dec. 27, 2019 (JP) .............................. JP2019-238645

(51) Int. Cl.
*H03H 7/40* (2006.01)
*H03H 7/00* (2006.01)

(52) U.S. Cl.
CPC .............. *H03H 7/40* (2013.01); *H03H 7/004* (2013.01)

(58) Field of Classification Search
CPC ............ H03H 7/40; H03H 7/004; H03H 7/38; H01J 37/32813
See application file for complete search history.

(56) References Cited

U.S. PATENT DOCUMENTS

| | | | |
|---|---|---|---|
| 6,174,450 B1 * | 1/2001 | Patrick | H01J 37/3299 438/10 |
| 7,251,121 B2 | 7/2007 | Bhutta | |
| 7,298,128 B2 | 11/2007 | Bhutta | |
| 8,264,154 B2 * | 9/2012 | Banner | H01J 37/32155 315/344 |
| 9,196,459 B2 | 11/2015 | Bhutta | |
| 9,306,533 B1 | 4/2016 | Mavretic | |
| 9,345,122 B2 | 5/2016 | Bhutta | |
| 9,496,122 B1 | 11/2016 | Bhutta | |
| 9,525,412 B2 | 12/2016 | Mavretic | |
| 9,543,122 B2 | 1/2017 | Bhutta | |
| 9,584,090 B2 | 2/2017 | Mavretic | |
| 9,591,739 B2 | 3/2017 | Bhutta | |
| 9,697,991 B2 | 7/2017 | Bhutta | |
| 9,728,378 B2 | 8/2017 | Bhutta et al. | |
| 9,729,122 B2 | 8/2017 | Mavretic | |
| 9,745,660 B2 | 8/2017 | Bhutta | |
| 9,755,641 B1 | 9/2017 | Bhutta | |
| 9,844,127 B2 | 12/2017 | Bhutta | |
| 9,865,432 B1 | 1/2018 | Bhutta | |
| 10,026,594 B2 | 7/2018 | Bhutta | |
| 10,217,608 B2 | 2/2019 | Mavretic | |

(Continued)

FOREIGN PATENT DOCUMENTS

JP 2017-69823 A 4/2017

*Primary Examiner* — John W Poos
(74) *Attorney, Agent, or Firm* — Bret E. Field; Bozicevic, Field & Francis LLP

(57) ABSTRACT

An impedance adjustment device includes a variable capacitor unit. A microcomputer changes the capacitance value of the variable capacitor unit by switching PIN diodes included in n capacitor circuits on or off separately. Thus, the impedance on the plasma generator side when viewed from a high frequency power supply is adjusted. When changing the capacitance value of the variable capacitor unit to a target capacitance value, the microcomputer changes the capacitance value. When a predetermined period passes after the change of the capacitance value, the microcomputer changes the capacitance value again.

6 Claims, 12 Drawing Sheets

(56) References Cited

U.S. PATENT DOCUMENTS

| | | |
|---|---|---|
| 10,340,879 B2 | 7/2019 | Mavretic et al. |
| 10,431,424 B2 | 10/2019 | Mavretic et al. |
| 10,431,428 B2 | 10/2019 | Bhutta et al. |
| 10,454,453 B2 | 10/2019 | Bhutta et al. |
| 10,455,729 B2 | 10/2019 | Bhutta |
| 10,460,912 B2 | 10/2019 | Bhutta et al. |
| 10,483,090 B2 * | 11/2019 | Bhutta .................. H03H 11/28 |
| 10,707,057 B2 | 7/2020 | Bhutta et al. |
| 10,727,029 B2 | 7/2020 | Ulrich et al. |
| 2004/0045506 A1 * | 3/2004 | Chen ................ H01J 37/32174 |
| | | 156/345.48 |
| 2016/0065207 A1 | 3/2016 | Bhutta |
| 2016/0380610 A1 | 12/2016 | Ulrich |
| 2017/0178865 A1 * | 6/2017 | Ulrich ............... H01J 37/32183 |
| 2018/0076788 A1 | 3/2018 | Decker et al. |
| 2019/0172683 A1 | 6/2019 | Mavretic et al. |
| 2019/0267212 A1 | 8/2019 | Mavretic |
| 2019/0272978 A1 | 9/2019 | Ahmed et al. |
| 2019/0326094 A1 | 10/2019 | Bhutta |
| 2019/0355554 A1 * | 11/2019 | Ulrich ................. H01L 21/0262 |
| 2020/0035461 A1 | 1/2020 | Bhutta et al. |
| 2020/0051788 A1 | 2/2020 | Ulrich |
| 2020/0066488 A1 | 2/2020 | Ulrich et al. |
| 2020/0066489 A1 | 2/2020 | Lozic et al. |
| 2020/0083022 A1 | 3/2020 | Huang et al. |
| 2020/0126765 A1 | 4/2020 | Ulrich et al. |

\* cited by examiner

F I G. 1
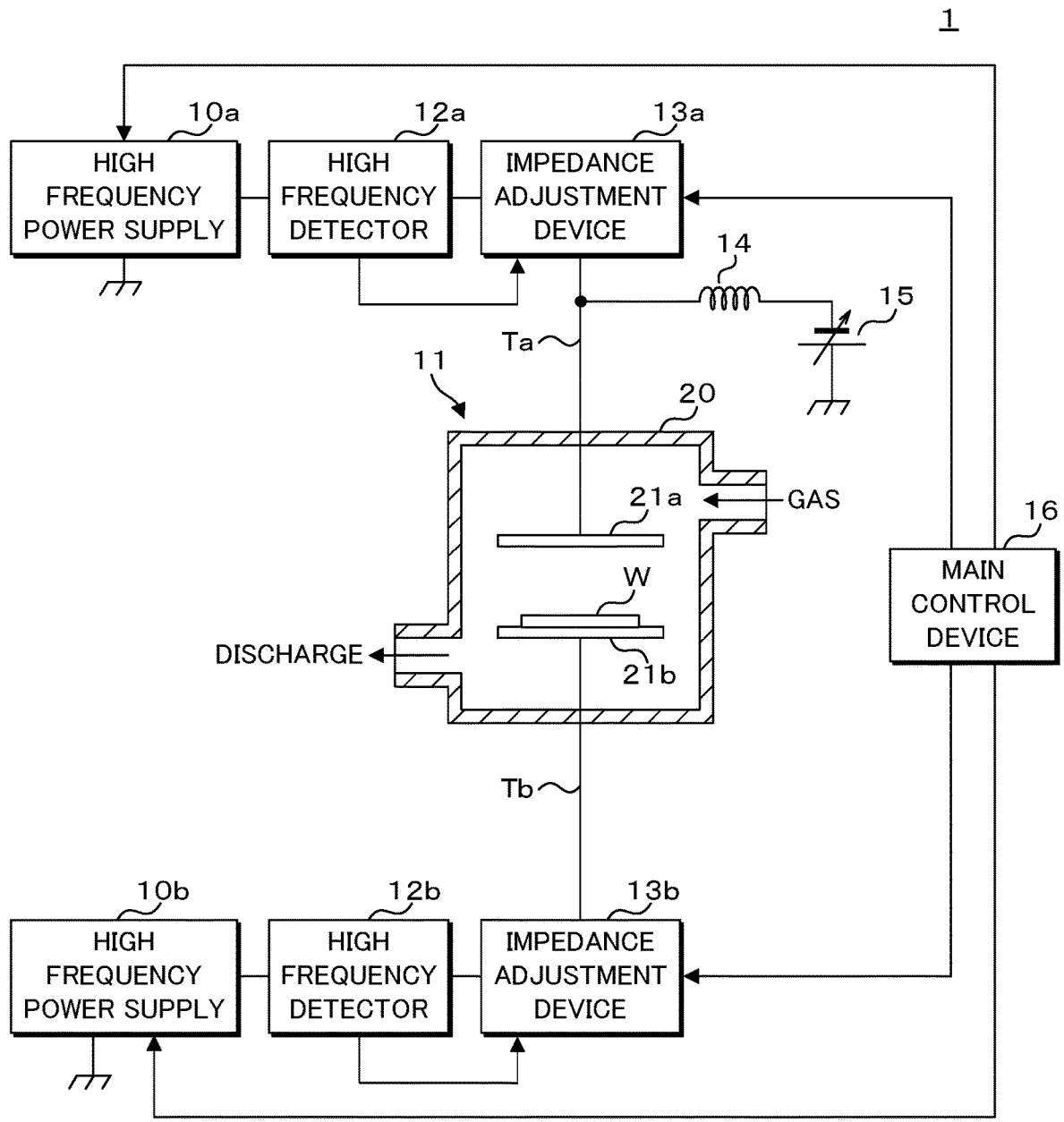

F I G. 2

| SETTING NUMBER | EXECUTION TIMING | AC POWER VALUE | DC VOLTAGE VALUE | GAS TYPE | GAS PRESSURE | GAS FLOW RATE |
|---|---|---|---|---|---|---|
| 1 | ⋮ | ⋮ | ⋮ | ⋮ | ⋮ | ⋮ |
| 2 | ⋮ | ⋮ | ⋮ | ⋮ | ⋮ | ⋮ |
| 3 | ⋮ | ⋮ | ⋮ | ⋮ | ⋮ | ⋮ |
| ... | ... | ... | ... | ... | ... | ... |

F I G. 4

| | CAPACITANCE VALUE [pF] OF CAPACITOR | STATE OF PIN DIODE | GROUP |
|---|---|---|---|
| CAPACITOR CIRCUIT A1 | 1 | 1 | GROUP G1 |
| CAPACITOR CIRCUIT A2 | 2 | 1 | |
| CAPACITOR CIRCUIT A3 | 4 | 1 | |
| CAPACITOR CIRCUIT A4 | 8 | 1 | |
| CAPACITOR CIRCUIT A5 | 16 | 1 | GROUP G2 |
| CAPACITOR CIRCUIT A6 | 32 | 1 | |
| CAPACITOR CIRCUIT A7 | 64 | 1 | |
| CAPACITOR CIRCUIT A8 | 128 | 0 | |

1 : ON
0 : OFF

F I G. 7

| SETTING NUMBER | CANDIDATE VALUE OF SET PERIOD | CANDIDATE VALUE OF REFERENCE PERIOD |
|---|---|---|
| 1 | ... | ... |
| 2 | ... | ... |
| ⋮ | ⋮ | ⋮ |

CANDIDATE VALUE OF SET PERIOD     SHORT ⟵⟶ LONG

CANDIDATE VALUE OF REFERENCE PERIOD     LONG ⟵⟶ SHORT

IMPEDANCE ADJUSTMENT DEVICE

CROSS-REFERENCE TO RELATED APPLICATION

This Nonprovisional application claims priority under 35 U.S.C. § 119(a) on Patent Application No. 2019-238645 filed in Japan on Dec. 27, 2019, the entire contents of which are hereby incorporated by reference.

FIELD

The present disclosure relates to an impedance adjustment device.

BACKGROUND

In a configuration in which a high frequency power supply applies a high frequency AC voltage to a load, an impedance adjustment device is disposed in midway of the transmission line of the AC voltage output from the high frequency power supply to the load. The impedance adjustment device adjusts the impedance on the load side when viewed from the high frequency power supply. Japan Patent Laid-Open Publication No. 2017-69823 discloses an impedance adjustment device. The impedance adjustment device includes a variable capacitor unit. In the variable capacitor unit, a plurality of series circuits are connected in parallel. In each series circuit, a capacitor is connected in series to a semiconductor switch.

The capacitance value of the variable capacitor unit is changed by switching on or off separately a plurality of semiconductor switches included in the variable capacitor unit. By changing the capacitance value of the variable capacitor unit, the impedance on the load side when viewed from the high frequency power supply is adjusted to match the complex conjugate of the output impedance of the high frequency power supply, or is adjusted so that the absolute value of the reflection coefficient on the load side when viewed from the high frequency power supply is minimized. So-called impedance matching is performed. As a result, electric power can be efficiently supplied to the load side. In the load, plasma for performing various processes is generated by the application of an AC voltage input from the high frequency power supply.

SUMMARY

In the impedance adjustment device disclosed by Japanese Patent Laid-Open Publication No. 2017-69823, a capacitor is connected in series to a semiconductor switch. Therefore, when the semiconductor switch is switched from OFF to ON, the capacitor connected to the semiconductor switch that is switched on is effective. When the semiconductor switch is switched from ON to OFF, the capacitor connected to the semiconductor switch that is switched off is not effective.

As described above, in the variable capacitor unit, a plurality of series circuits are connected in parallel. In each series circuit, the capacitor is connected in series to the semiconductor switch. Therefore, the total value of the capacitance values of the effective capacitors is the capacitance value of the variable capacitor unit.

In a configuration in which the capacitance value of the variable capacitor unit is changed by switching a plurality of semiconductor switches on or off separately, the capacitance value of the variable capacitor unit can be changed at high speed. Therefore, high speed impedance matching can be realized.

The transient response of a semiconductor switch depends on the characteristics of the semiconductor switch used. However, the period of the transient response of the semiconductor switch is usually in the range of several tens of μsec to one hundred and several tens of μsec. Therefore, when the semiconductor switch is switched on or off, a steep impedance change may occur. When a steep impedance change occurs, the plasma state in the load may become unstable. It has been confirmed that the plasma itself disappears when the semiconductor switch is switched on or off in a state in which the plasma is unstable.

The present disclosure has been made in view of such circumstances, and it is an object of the present disclosure to provide an impedance adjustment device capable of preventing a load from becoming unstable in a configuration in which the capacitance value of a variable capacitor unit is changed by switching a semiconductor switch on or off.

An impedance adjustment device according to an aspect of the present disclosure is to be disposed in midway of a transmission line of an AC voltage output from an AC power supply to a load and adjusts an impedance on the load side when viewed from the AC power supply. The impedance adjustment device includes: a variable capacitor unit including a plurality of capacitors and a plurality of semiconductor switches; a capacitance value changing unit that changes a capacitance value of the variable capacitor unit by switching the plurality of semiconductor switches on or off separately; and a determining unit that determines a target capacitance value of the capacitance value of the variable capacitor unit. In the variable capacitor unit, a plurality of capacitor circuits are connected in parallel. In each capacitor circuit, the capacitor is connected in series to the semiconductor switch. When changing the capacitance value to the target capacitance value determined by the determining unit, the capacitance value changing unit changes the capacitance value. When a predetermined period passes after the change of the capacitance value, the capacitance value changing unit changes the capacitance value again.

In the aspect described above, in the load, for example, plasma is generated by using the AC voltage output from the AC power supply. When changing the capacitance value of the variable capacitor unit to the target capacitance value, the capacitance value of the variable capacitor unit is changed to a capacitance value different from the target capacitance value. When a predetermined period passes after the change of the capacitance value of the variable capacitor unit, the capacitance value of the variable capacitor unit is changed again. Thus, a steep impedance change can be suppressed. In this case, since the plasma of the load can follow the impedance change, it is possible to prevent the load from becoming unstable.

In an impedance adjustment device according to an aspect of the present disclosure, the predetermined period is arbitrarily settable according to a process condition of a process performed in the load.

In the aspect described above, it is possible to make fine adjustments according to the process conditions.

According to the present disclosure, it is possible to prevent the load from becoming unstable in a configuration in which the capacitance value of the variable capacitor unit is changed by switching the semiconductor switch on or off.

The above and further objects and features will move fully be apparent from the following detailed description with accompanying drawings.

BRIEF DESCRIPTION OF THE DRAWINGS

FIG. 1 is a block diagram showing the main configuration of a plasma apparatus according to the present embodiment.

FIG. 2 is a chart showing an example of set values required for processing in a plasma generator.

FIG. 4 is an explanatory diagram of the capacitance value of a variable capacitor unit.

FIG. 7 is a chart showing candidate values of a set period and a reference period corresponding to a setting number.

DETAILED DESCRIPTION OF NON-LIMITING EXAMPLE EMBODIMENTS

Figure 3:
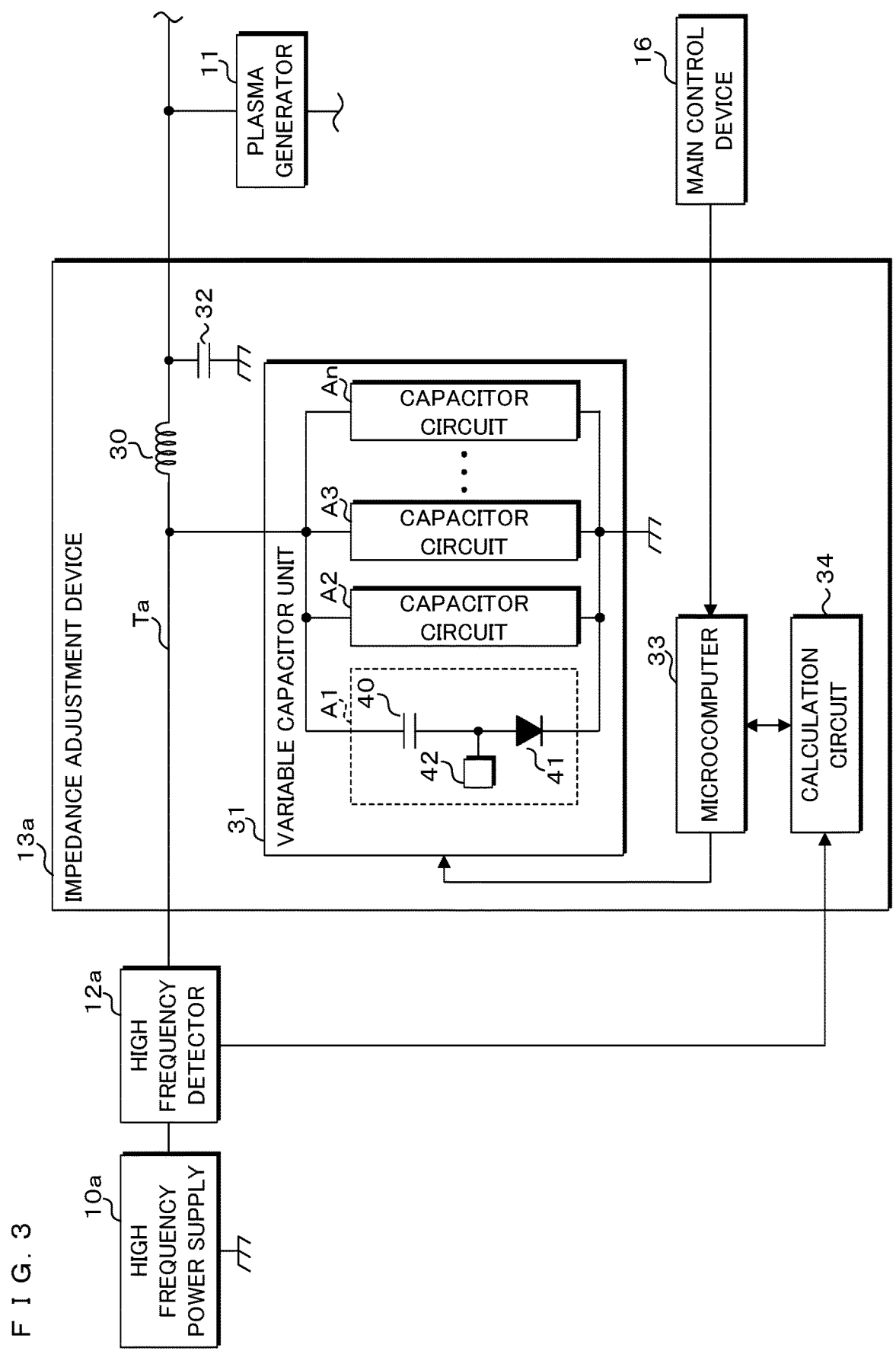
FIG. 3 is a block diagram showing the main configuration of an impedance adjustment device.

Hereinafter, the present disclosure will be described in detail with reference to the diagrams showing embodiments thereof.

<Configuration of Plasma Apparatus>

FIG. 1 is a block diagram showing the main configuration of a plasma apparatus 1 according to the present embodiment. The plasma apparatus 1 is an apparatus that performs processing on a processing target W, for example, a wafer. The plasma apparatus 1 includes high frequency power supplies 10a and 10b, a plasma generator 11, high frequency detectors 12a and 12b, impedance adjustment devices 13a and 13b, an inductor 14, a DC power supply 15, and a main control device 16. The plasma generator 11 includes a box-shaped chamber 20 and plate-shaped electrodes 21a and 21b. FIG. 1 shows a cross section of the chamber 20.

The type of the plasma generator 11 is a capacitive coupling type. Two through holes are provided in the chamber 20. Gas is injected into the chamber 20 through one of the through holes.

The substance in the chamber 20 is discharged from the other through hole. The two electrodes 21a and 21b are housed in the chamber 20. The plate surfaces of the electrodes 21a and 21b face each other.

A transmission line Ta indicates a transmission line from the high frequency power supply 10a to the plasma generator 11. The high frequency power supply 10a is connected to the electrode 21a of the plasma generator 11 through the transmission line Ta. The high frequency detector 12a and the impedance adjustment device 13a are disposed in midway of the transmission line Ta. The high frequency detector 12a is located between the high frequency power supply 10a and the impedance adjustment device 13a. The high frequency power supply 10a is grounded.

Similarly, a transmission line Tb indicates a transmission line from the high frequency power supply 10b to the plasma generator 11. The high frequency power supply 10b is connected to the electrode 21b of the plasma generator 11 through the transmission line Tb. The high frequency detector 12b and the impedance adjustment device 13b are disposed in midway of the transmission line Tb. The high frequency detector 12b is located between the high frequency power supply 10b and the impedance adjustment device 13b. The high frequency power supply 10b is grounded.

The electrode 21a is connected to the negative electrode of the DC power supply 15 through the inductor 14. The positive electrode of the DC power supply 15 is grounded.

Each of the high frequency power supplies 10a and 10b is an AC power supply that outputs an AC voltage having a high frequency. Hereinafter, the frequency of the AC voltage output from each of the high frequency power supplies 10a and 10b will be referred to as an output frequency. The output frequency is, for example, a frequency belonging to the industrial radio frequency (RF) band. Frequencies belonging to the industrial RF band are 400 kHz, 2 MHz, 13.56 MHz, 27.12 MHz, 40.68 MHz, 60 MHz, and the like. In general, the output frequency of the high frequency power supply 10a is higher than the output frequency of the high frequency power supply 10b. For example, the output frequencies of the high frequency power supplies 10a and 10b are 13.56 MHz and 400 kHz, respectively.

The high frequency power supply 10a outputs an AC voltage to the electrode 21a of the plasma generator 11 through the high frequency detector 12a and the impedance adjustment device 13a. At this time, the AC voltage output from the high frequency power supply 10a is transmitted through the transmission line Ta. Since the inductance of the inductor 14 is sufficiently large, the AC voltage does not pass through the inductor 14. Therefore, the AC voltage is not output to the DC power supply 15.

Similarly, the high frequency power supply 10b outputs the AC voltage to the electrode 21 of the plasma generator 11 through the high frequency detector 12b and the impedance adjustment device 13b. At this time, the AC voltage output from the high frequency power supply 10b is transmitted through the transmission line Tb. The output impedance of each of the high frequency power supplies 10a and 10b is expressed by, for example, only the real part. In this case, the output impedance is, for example, 50Ω. The plasma generator 11 functions as a load.

The AC voltages output from the high frequency power supplies 10a and 10b are applied to the electrodes 21a and 21b, respectively. The DC power supply 15 applies a negative DC voltage to the electrode 21a through the inductor 14. The entire electrodes 21a and 21b function as an application body to which a voltage is applied. The DC power supply 15 is not always required. The output voltage of the DC power supply 15 is not directly related to the control of the impedance adjustment device 13a and the impedance adjustment device 13b.

When the high frequency power supplies 10a and 10b apply AC voltages to the electrodes 21a and 21b in a state in which the gas is injected into the chamber 20, plasma is generated between the electrodes 21a and 21b. The user arranges the processing target W on the plate surface of the electrode 21b on the electrode 21a side. Processes using plasma are performed on the processing target W. The processes using plasma are processes, such as etching and chemical vapor deposition (CVD).

In the chamber 20 of the plasma generator 11, a plurality of processes using plasma are sequentially performed. Depending on the process, at least one of AC powers, DC voltage, the gas type, the gas pressure, and the gas flow rate is adjusted. Here, AC powers are supplied from the high frequency power supplies 10a and 10b to the electrodes 21a and 21b, respectively. The DC voltage is applied by the DC power supply 15. The gas is injected into the chamber 20. The state of plasma generated in the plasma generator 11 changes according to the values of the AC powers, the DC voltage, the gas type, the gas pressure, and the gas flow rate. Therefore, the impedance of the plasma generator 11 changes. A condition represented by AC power values, a DC voltage value, a gas type, a gas pressure, and a gas flow rate, and the like are determined according to the process performed in the chamber 20 of the plasma generator 11. Here, AC powers are supplied from the high frequency power supplies 10a and 10b to the electrodes 21a and 21b, respectively. The DC voltage is applied to the electrode 21a by the DC power supply 15. The gas is injected into the chamber 20. The execution timing at which the process is performed is also determined.

FIG. 2 is a chart showing an example of set values required for processing in the plasma generator 11. FIG. 2 shows the execution timing, two AC power values, a DC voltage value, a gas type, a gas pressure, and a gas flow rate. Here, the two AC powers are supplied to the electrodes 21a and 21b, respectively. The DC voltage is applied to the electrode 21a. A number is set for each combination of execution timing, two AC power values, a DC voltage value, a gas type, a gas pressure, and a gas flow rate. This number is described as a setting number.

When the plasma generator 11 operates, each device is notified of the required set values at the timings when a plurality of processes using plasma are sequentially performed. For example, the main control device 16 notifies the high frequency power supplies 10a and 10b of the values of the AC powers to be output from the high frequency power supplies 10a and 10b. If necessary, the main control device 16 notifies the impedance adjustment devices 13a and 13b of the values of the AC powers to be output from the high frequency power supplies 10a and 10b. After the main control device 16 notifies the high frequency power supplies 10a and 10b of the required set values, the high frequency power supplies 10a and 10b may notify the impedance adjustment devices 13a and 13b of the notified set values.

The high frequency power supplies 10a and 10b and the impedance adjustment devices 13a and 13b may acquire information regarding the set values shown in FIG. 2 in advance. In this configuration, the main control device 16 notifies the high frequency power supplies 10a and 10b and the impedance adjustment devices 13a and 13b of the setting numbers shown in FIG. 2 at the timings when a plurality of processes using plasma are sequentially performed. By notifying the setting numbers, the high frequency power supplies 10a and 10b and the impedance adjustment devices 13a and 13b can recognize the required set values.

When the set values are notified by the main control device 16, each device performs a process according to the notified set values.

The processes are performed sequentially. For example, when the setting number is 2, the AC power output from the high frequency power supply 10a is set to 1400 W, and the AC power output from the high frequency power supply 10b is set to 600 W. At this time, the type of gas is, for example, argon. Notification of set values, such as a gas pressure and a gas flow rate, is provided to a device that requires the set values.

When a predetermined period has passed after the notification of the setting number 2, the high frequency power supplies 10a and 10b are notified of set values corresponding to the setting number 3. Thus, for example, the AC powers output from the high frequency power supplies 10a and 10b are changed to 2000 W and 700 W, respectively.

It is noted that, the above-described set values are examples. The values of the AC powers to be output from the high frequency power supplies 10a and 10b are not limited to the above-described values. The elements of set values may include an element different from the elements shown in FIG. 2.

For example, when the waveform of the AC power output from each of the high frequency power supplies 10a and 10b is a pulse waveform, the main control device 16 may notify the high frequency power supplies 10a and 10b of the duty ratio of the AC voltage and the like. When the output frequencies of the high frequency power supplies 10a and 10b are changeable, the main control device 16 may notify the high frequency power supplies 10a and 10b of the output frequencies to be changed.

The various conditions described above are referred to as process conditions in the present embodiment.

The high frequency detector 12a periodically detects one of following two parameters. One parameter is used to calculate the impedance on the plasma generator 11 side when viewed from the high frequency power supply 10a. The other parameter is used to calculate the reflection coefficient on the plasma generator 11 side when viewed from the high frequency power supply 10a. Hereinafter, the impedance on the plasma generator 11 side when viewed from the high frequency power supply 10a will be referred to as a first load side impedance. The reflection coefficient of the AC voltage when viewed from the high frequency power supply 10a is referred to as a first reflection coefficient. In general, the reflection coefficient is a complex number. The absolute value of the reflection coefficient is 0 or more and 1 or less.

The first load side impedance is one of following two impedances. One impedance is an impedance when the plasma generator 11 side is viewed from the output end of the high frequency power supply 10a. The other impedance is an impedance when the plasma generator 11 side is viewed from the input end of the AC voltage in the impedance adjustment device 13a. The input end of the impedance adjustment device 13a corresponds to the output end of the high frequency power supply 10a. The first load side impedance is a combined impedance obtained by combining the impedance of the impedance adjustment device 13a and the impedance of the plasma generator 11.

The high frequency detector 12a detects, as first example of the parameters, an AC voltage and an AC current transmitted through the high frequency detector 12a and a phase difference between the AC voltage and the AC current. The high frequency detector 12a detects, as second example of the parameters, forward wave power (or forward wave voltage) and reflected wave power (or reflected wave voltage). The forward wave voltage is an AC voltage transmitting from the high frequency power supply 10a to the plasma generator 11. The forward wave power is the power of the forward wave voltage. The reflected wave voltage is an AC voltage that is reflected by the plasma generator 11 and that transmits toward the high frequency power supply 10a. The reflected wave power is the power of the reflected wave voltage. Each time the high frequency detector 12a detects parameters, the high frequency detector 12a outputs, to the impedance adjustment device 13a, parameter information indicating the detected parameters.

The impedance adjustment device 13a adjusts the first load side impedance by changing the impedance of the impedance adjustment device 13a. Specifically, based on the parameter information input from the high frequency detector 12a, the impedance adjustment device 13a adjusts the impedance of the impedance adjustment device 13a so that the first load side impedance becomes a complex conjugate of the output impedance of the high frequency power supply 10a or so that the first reflection coefficient is minimized. So-called impedance matching is performed. Thus, electric power can be efficiently supplied to the plasma generator 11 side.

When the first load side impedance does not become the complex conjugate of the output impedance, the impedance adjustment device 13a adjusts the impedance of the impedance adjustment device 13a so that the first load side impedance becomes a value closest to the complex conjugate of the output impedance of the high frequency power supply 10a. The impedance adjustment device 13a performs a process according to the setting number output from the main control device 16.

The impedance on the plasma generator 11 side when viewed from the high frequency power supply 10b is referred to as a second load side impedance. The reflection coefficient of the AC voltage when viewed from the high frequency power supply 10b is referred to as a second reflection coefficient. The high frequency detector 12b and the impedance adjustment device 13b operate in the similar manner as the high frequency detector 12a and the impedance adjustment device 13a, respectively. The first load side impedance and the first reflection coefficient correspond to the second load side impedance and the second reflection coefficient, respectively.

<Configuration of Impedance Adjustment Device 13a>

FIG. 3 is a block diagram showing the main configuration of the impedance adjustment device 13a. As described above, the impedance adjustment device 13b is configured in the similar manner as the impedance adjustment device 13a. Hereinafter, the configuration of the impedance adjustment device 13a will be described. The description of the configuration of the impedance adjustment device 13b will be omitted. The transmission line Ta corresponds to the transmission line Tb.

The impedance adjustment device 13a includes an inductor 30, a variable capacitor unit 31, a capacitor 32, a microcomputer 33, and a calculation circuit 34. The inductor 30 is disposed in midway of the transmission line Ta. One end of the variable capacitor unit 31 is connected to one end of the inductor 30 on the high frequency detector 12a side. One end of the capacitor 32 is connected to one end of the inductor 30 on the plasma generator 11 side. The other ends of the variable capacitor unit 31 and the capacitor 32 are grounded.

The circuit including the inductor 30, the variable capacitor unit 31, and the capacitor 32 is a π-type circuit. The type of the circuit included in the impedance adjustment device 13a is not limited to the π type, and may be an L type, a T type, or the like. The following circuit can be mentioned as a first example of the L-type circuit. In this circuit, one end of the variable capacitor unit 31 is connected to one end or the other end of a series circuit including the inductor 30 and the capacitor 32. The other end of the variable capacitor unit 31 is grounded. The capacitor 32 is disposed in midway of the transmission line Ta and is connected to the plasma generator 11. The following circuit can be mentioned as a second example of the L-type circuit. In this circuit, one end of the capacitor 32 is connected to one end or the other end of a series circuit including the inductor 30 and the variable capacitor unit 31. The other end of the capacitor 32 is grounded. The variable capacitor unit 31 is disposed in midway of the transmission line Ta and is connected to the high frequency detector 12a. It is noted that, instead of the capacitor 32, another variable capacitor unit 31 may be disposed.

The following circuit can be mentioned as an example of the T-type circuit. In this circuit, the inductor 30 are connected in series to a second inductor (not shown). One end of the variable capacitor unit 31 is connected to a connection node between the inductor 30 and the second inductor. The other end of the variable capacitor unit 31 is grounded.

Hereinafter, an example in which the impedance adjustment device 13a includes a π-type circuit will be described.

The variable capacitor unit 31 includes n capacitor circuits A1, A2, . . . , An connected in parallel. Here, n is an integer of 2 or more. Each of the capacitor circuits A1, A2, . . . , An includes a capacitor 40, a PIN diode 41, and a driving unit 42. In each of the capacitor circuits A1, A2, . . . , An, one end of the capacitor 40 is connected to one end of the inductor 30. The other end of the capacitor 40 is connected to the anode of the PIN diode 41. The cathode of the PIN diode 41 is grounded. In this manner, the capacitor 40 is connected in series to the PIN diode 41. The driving unit 42 is connected to a connection node between the capacitor 40 and the PIN diode 41.

The parallelism of n capacitor circuits A1, A2, . . . , An does not mean strict parallelism, but means substantial parallelism. Therefore, for example, a series circuit of the capacitor circuit A2 and a resistor (not shown) may be connected between both ends of the capacitor circuit A1.

The driving unit 42 applies, to the anode of the PIN diode 41, a positive voltage having reference potential corresponding to a ground potential. Thus, a forward voltage is applied to the PIN diode 41. In addition, the driving unit 42 applies, to the anode of the PIN diode 41, a negative voltage having reference potential corresponding to the ground potential. Thus, a reverse voltage is applied to the PIN diode 41.

In the PIN diode 41, P-type, I-type, and N-type semiconductor layers are bonded to each other. The I-type semiconductor is an intrinsic semiconductor. The I-type semiconductor layer is disposed between the P-type semiconductor layer and the N-type semiconductor layer. An anode and a cathode are provided on the P-type semiconductor layer and the N-type semiconductor layer, respectively. The PIN diode 41 functions as a switch.

When the driving unit 42 applies a forward voltage to the PIN diode 41, the resistance value between both ends of the PIN diode 41 drops to a sufficiently small value. As a result, the PIN diode 41 is switched on. When the driving unit 42 applies a reverse voltage to the PIN diode 41, the resistance value between both ends of the PIN diode 41 rises to a sufficiently large value. As a result, the PIN diode 41 is switched off. As described above, the driving unit 42 switches on or off the PIN diode 41 connected to the driving unit 42. When the PIN diode 41 is ON, the AC voltage can pass through the PIN diode 41. When the PIN diode 41 is OFF, the AC voltage cannot pass through the PIN diode 41.

The microcomputer 33 outputs a high level voltage or a low level voltage to the n driving units 42 of the variable capacitor unit 31. When the voltage input from the microcomputer 33 is switched from the low level voltage to the high level voltage, each driving unit 42 switches the PIN diode 41 on. When the voltage input from the microcomputer 33 is switched from the high level voltage to the low level voltage, each driving unit 42 switches the PIN diode 41 off.

FIG. 4 is an explanatory diagram of the capacitance value of the variable capacitor unit 31. FIG. 4 shows an example in which n is 8. In FIG. 4, the capacitance value of the capacitor 40 and the state of the PIN diode 41 are shown for each of the capacitor circuits A1, A2, . . . , An. ON and OFF are indicated by 1 and 0, respectively.

When the number of PIN diodes 41 in the ON state is 2 or more, the capacitance value of the variable capacitor unit 31 is expressed by the sum of the capacitance values of the plurality of capacitors 40 connected to the plurality of PIN diodes 41 in the ON state. When the number of PIN diodes 41 in the ON state is 1, the capacitance value of the variable capacitor unit 31 is expressed by the capacitance value of the capacitor 40 connected to the PIN diode 41 in the ON state.

The capacitance value of the capacitor 40 included in the capacitor circuit Ai (i=1, 2, . . . , n) is expressed by the product of a positive real number H and (i−1)-th power of 2. In the example of FIG. 4, the real number H is 1 pF. Thus, the capacitance value of the variable capacitor unit 31 can be adjusted at an interval of the real number H. In the example of FIG. 4, the capacitance value of the variable capacitor unit 31 can be adjusted at an interval of 1 pF. In the example of FIG. 4, since the seven PIN diodes 41 of the capacitor circuits A1, A2, . . . , A7 are ON, the capacitance value of the variable capacitor unit 31 is 127 pF.

In the impedance adjustment device 13a, the n capacitor circuits A1, A2, . . . , An are divided into k groups G1, G2, . . . , Gk. Here, k is an integer of 2 or more and n or less. FIG. 4 shows groups to which the n capacitor circuits A1, A2, . . . , An belong. When the number of groups, that is, k is 2, for example, as shown in FIG. 4, the capacitor circuits A1 to A4 belong to the group G1. The capacitor circuits A5 to A8 belong to the group G2.

The capacitance value range of a group Gj (j=1, 2, . . . , K) is determined by the minimum and maximum values of the capacitors 40 belonging to the group Gj. The capacitance value range of the group Gj is different from the capacitance value ranges of all groups excluding the group Gj among the groups G1, G2, . . . , Gk. In the example of FIG. 4, the capacitance value range of the group G1 is a range of 1 pF to 8 pF. The capacitance value range of the group G2 is a range of 16 pF to 128 pF. The capacitance value ranges of the groups G1 and G2 are different from each other. The value of the capacitance value range of the group G1 is the smallest. As the number of the group increases, the value of the capacitance value range increases. Therefore, the value of the capacitance value range of the group Gk is the largest.

In the example of FIG. 4, the capacitance value range of the group G1 is a range of 1 pF to 8 pF. The capacitance value range of the group G2 is a range of 16 pF to 128 pF. The capacitance value ranges of the groups G1 and G2 are different from each other.

The high frequency detector 12a shown in FIGS. 1 and 3 outputs parameter information to the calculation circuit 34 of the impedance adjustment device 13a. The microcomputer 33 outputs, to the calculation circuit 34, a mask signal configured by a high level voltage and a low level voltage.

The calculation circuit 34 is formed by, for example, a field-programmable gate array (FPGA). The calculation circuit 34 performs a calculation process for calculating the first load side impedance or the first reflection coefficient. In the calculation process, when the mask signal indicates a low level voltage, the calculation circuit 34 repeatedly calculates the first load side impedance or the first reflection coefficient based on the parameters indicated by the parameter information input from the high frequency detector 12a. The calculation circuit 34 calculates an average value of a plurality of first load side impedances or of a plurality of first reflection coefficients calculated during the reference period each time the reference period passes. The calculation circuit 34 outputs, to the microcomputer 33, average information indicating the calculated average value. The calculation circuit 34 stops the calculation when the mask signal indicates a high level voltage.

The microcomputer 33 outputs, to the calculation circuit 34, period information indicating a period. When the period information is input, the calculation circuit 34 performs a change process for changing the reference period. In the change process, the calculation circuit 34 changes the reference period to the period indicated by the period information input from the microcomputer 33, and ends the change process.

When the average information is input from the calculation circuit 34, the microcomputer 33 calculates the capacitance value of the variable capacitor unit 31 based on the average value of the first load side impedance or of the first reflection coefficient, the average value being indicated by the average information input from the calculation circuit 34. When the average information indicates the average value of the first load side impedance, the microcomputer 33 calculates the capacitance value of the variable capacitor unit 31 at which the first load side impedance becomes a complex conjugate of the output impedance of the high frequency power supply 10a. When the average information indicates the average value of the first reflection coefficient, the microcomputer 33 calculates the capacitance value of the variable capacitor unit 31 at which the first reflection coefficient becomes 0. The microcomputer 33 determines a target capacitance value of the capacitance value of the variable capacitor unit 31 based on the calculated capacitance value. The target capacitance value is a capacitance value that can be realized in the variable capacitor unit 31. The target capacitance value is a capacitance value that matches the calculated capacitance value or is closest to the calculated capacitance value.

As described above, the microcomputer 33 switches, to a high level voltage or a low level voltage, each of the output voltages which are output to the n driving units 42 included in the variable capacitor unit 31. Thus, the n PIN diodes 41 included in the variable capacitor unit 31 are switched on or off separately. The microcomputer 33 changes the capacitance value of the variable capacitor unit 31 by switching the n PIN diodes 41 on or off separately.

When changing the capacitance value of the variable capacitor unit 31 to the target capacitance value, first, the microcomputer 33 changes the capacitance value of the variable capacitor unit 31 to a relay capacitance value different from the target capacitance value. When a set period passes after the change of the capacitance value to the relay capacitance value, the microcomputer 33 changes the capacitance value to another relay capacitance value or the target capacitance value. The main control device 16 outputs the setting number to the microcomputer 33. When the setting number is input, the microcomputer 33 changes the set period to a period corresponding to the input setting number. In addition, when the setting number is input, the microcomputer 33 outputs, to the calculation circuit 34, period information which indicates the candidate value of the reference period corresponding to the input setting number.

Hereinafter, the calculation process of the calculation circuit 34 and the operation of the microcomputer 33 will be described in detail.

<Calculation Process of Calculation Circuit 34>

Figure 5:
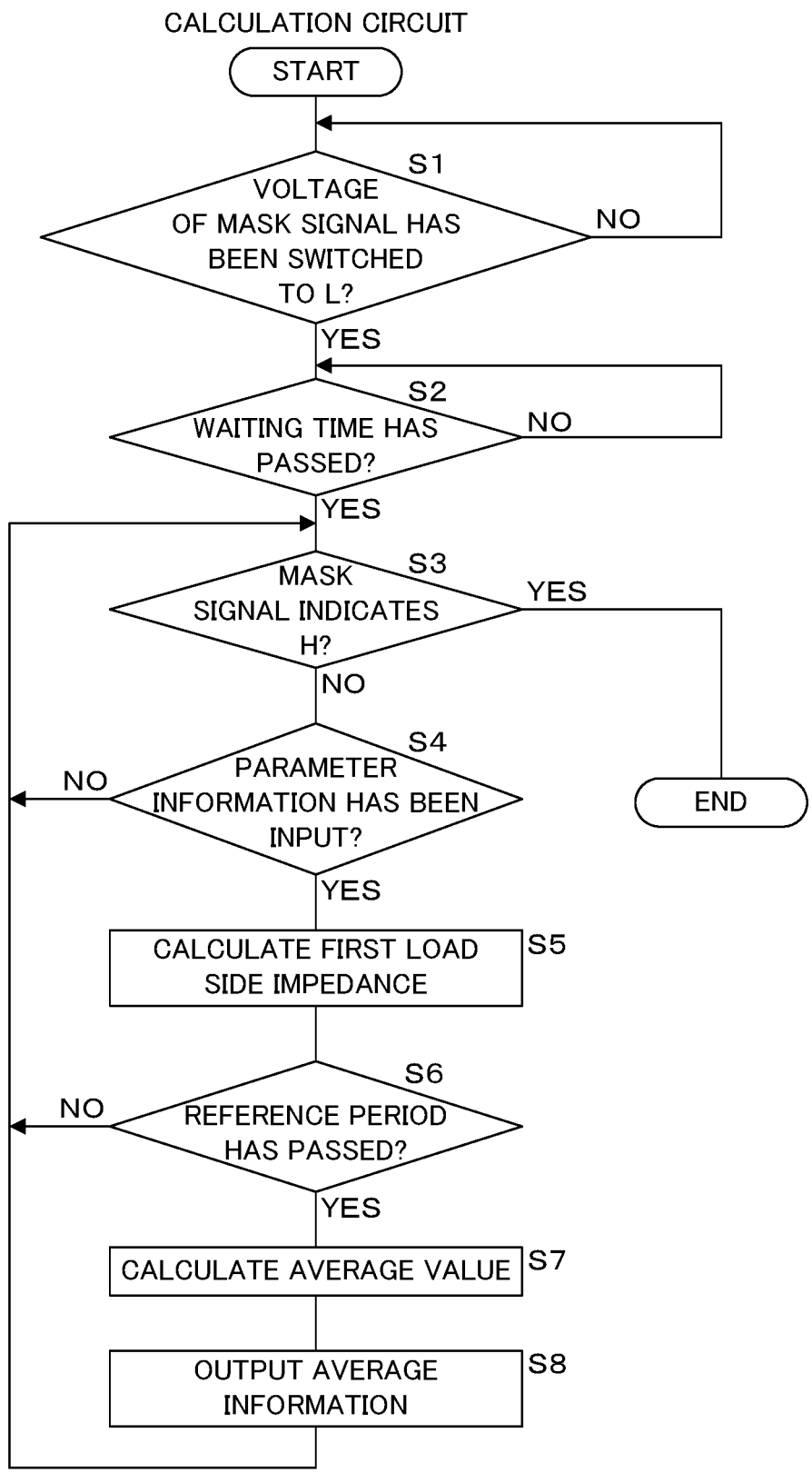
FIG. 5 is a flowchart showing the procedure of a calculation process of a calculation circuit.

FIG. 5 is a flowchart showing the procedure of the calculation process of the calculation circuit 34. In FIG. 5, the high level voltage is indicated by "H". The low level voltage is indicated by "L". Also in diagrams other than FIG. 5, the high level voltage and the low level voltage are indicated by "H" and "L", respectively. Here, the calculation process for calculating the first load side impedance will be described.

The calculation circuit 34 starts the calculation process in a state in which the mask signal input from the microcomputer 33 indicates a high level voltage. In the calculation process, the calculation circuit 34 determines whether or not the voltage of the mask signal input from the microcomputer 33 has been switched from the high level voltage to the low level voltage (step S1). When it is determined that the voltage of the mask signal has not been switched to the low level voltage (S1: NO), the calculation circuit 34 executes step S1 again and waits until the voltage indicated by the mask signal is switched to the low level voltage.

When it is determined that the mask signal voltage has been switched to the low level voltage (S1: YES), the calculation circuit 34 determines whether or not the waiting time has passed after the switching of the voltage of the mask signal to the low level voltage (step S2). The waiting time is a fixed value, and is set in advance. When the calculation circuit 34 includes a timer (not shown), the timer measures the time that has passed after the switching of the voltage of the mask signal to the low level voltage. The calculation circuit 34 determines whether or not the waiting time has passed based on the time measured by the timer. When it is determined that the waiting time has not passed (S2: NO), the calculation circuit 34 executes step S2 again and waits until the waiting time passes.

When it is determined that the waiting time has passed (S2: YES), the calculation circuit 34 determines whether or not the mask signal input from the microcomputer 33 indicates a high level voltage (step S3). When it is determined that the mask signal indicates a high level voltage (S3: YES), the calculation circuit 34 ends the calculation process and starts the calculation process again. When the mask signal does not indicate a high level voltage, that is, when the mask signal indicates a low level voltage (S3: NO), the calculation circuit 34 determines whether or not the parameter information has been input from the high frequency detector 12a (step S4). When it is determined that the parameter information has not been input (S4: NO), the calculation circuit 34 executes step S3 again. When the voltage of the mask signal is maintained at a low level voltage, the calculation circuit 34 waits until the parameter information is input.

When it is determined that the parameter information has been input (S4: YES), the calculation circuit 34 calculates the first load side impedance based on the parameters indicated by the parameter information input from the high frequency detector 12a (step S5). As described above, in the calculation process, the calculation circuit 34 outputs the average information to the microcomputer 33. The calculation circuit 34 determines whether or not the reference period has passed after the elapse of the waiting time or after the output of the average information (step S6). As described above, the reference period is changed to a period corresponding to the state of the plasma generator 11 in the reference period change process.

When the calculation circuit 34 includes a timer, the timer measures the time that has passed after the elapse of the waiting time or after the output of the average information. In step S6, the calculation circuit 34 determines whether or not the reference period has passed based on the time measured by the timer.

When it is determined that the reference period has not passed (S6: NO), the calculation circuit 34 executes step S3 again. When the voltage of the mask signal is maintained at a low level voltage, the calculation circuit 34 calculates the first load side impedance again. The cycle in which the high frequency detector 12a outputs parameter information is sufficiently shorter than the reference period. Therefore, the calculation circuit 34 executes step S5 twice or more until the reference period passes.

When it is determined that the reference period has passed (S6: YES), the calculation circuit 34 calculates an average value of the plurality of first load side impedances calculated until the reference period passes (step S7). Then, the calculation circuit 34 outputs, to the microcomputer 33, average information indicating the calculated average value (step S8). The calculation circuit 34 executes step S8 and then executes step S3 again.

As described above, when the voltage of the mask signal is maintained at a low level voltage, the calculation circuit 34 repeatedly calculates the first load side impedance until the reference period passes. When the reference period passes, the calculation circuit 34 calculates an average value of the plurality of first load side impedances calculated during the reference period. The calculation circuit 34 outputs, to the microcomputer 33, average information indicating the calculated average value. When the voltage of the mask signal is switched to the high level voltage, the calculation circuit 34 stops the calculation of the first load side impedance. When the voltage of the mask signal is switched to the low level voltage, the calculation circuit 34 restarts the calculation of the first load side impedance and the average value again after the waiting time passes after switching to the low level voltage. The calculation circuit 34 functions as a repetitive calculation unit that repeatedly calculates the first load side impedance and as an average value calculation unit that calculates the average value of a plurality of first load side impedances.

The calculation process for calculating the first reflection coefficient is similar to the calculation process for calculating the first load side impedance. The calculation process for calculating the first reflection coefficient can be described by replacing the first load side impedance with the first reflection coefficient in the description of the first load side impedance calculation process. The control unit 56 of the impedance adjustment device 13b performs a second load side impedance calculation process (or a second reflection coefficient calculation process). The second load side impedance calculation process (or the second reflection coefficient calculation process) is similar to the first load side impedance calculation process (or the first reflection coefficient calculation process).

The calculation circuit 34 may be configured to include a processor that executes processing. The processor is, for example, a central processing unit (CPU). In the case where the calculation circuit 34 includes the processor, in the calculation circuit 34, a computer program is stored in a storage unit (not shown). The processor executes the calculation process by executing the computer program.

The computer program may be stored in a storage medium so as to be readable by the processor of the calculation circuit 34. In this case, the computer program read from the storage medium by a reader (not shown) is written in the storage unit of the calculation circuit 34. The storage medium is an optical disk, a flexible disk, a magnetic disk, a magneto-optical disk, a semiconductor memory, or the like. The optical disk is a compact disc (CD)-read only memory (ROM), a digital versatile disc (DVD)-ROM, a Blu-ray (registered trademark) disc (BD), or the like. The magnetic disk is, for example, a hard disk. In addition, a computer program may be downloaded from an external device (not shown) connected to a communication network (not shown), and the downloaded computer program may be written in a storage unit.

<Configuration of Microcomputer 33>

Figure 6:
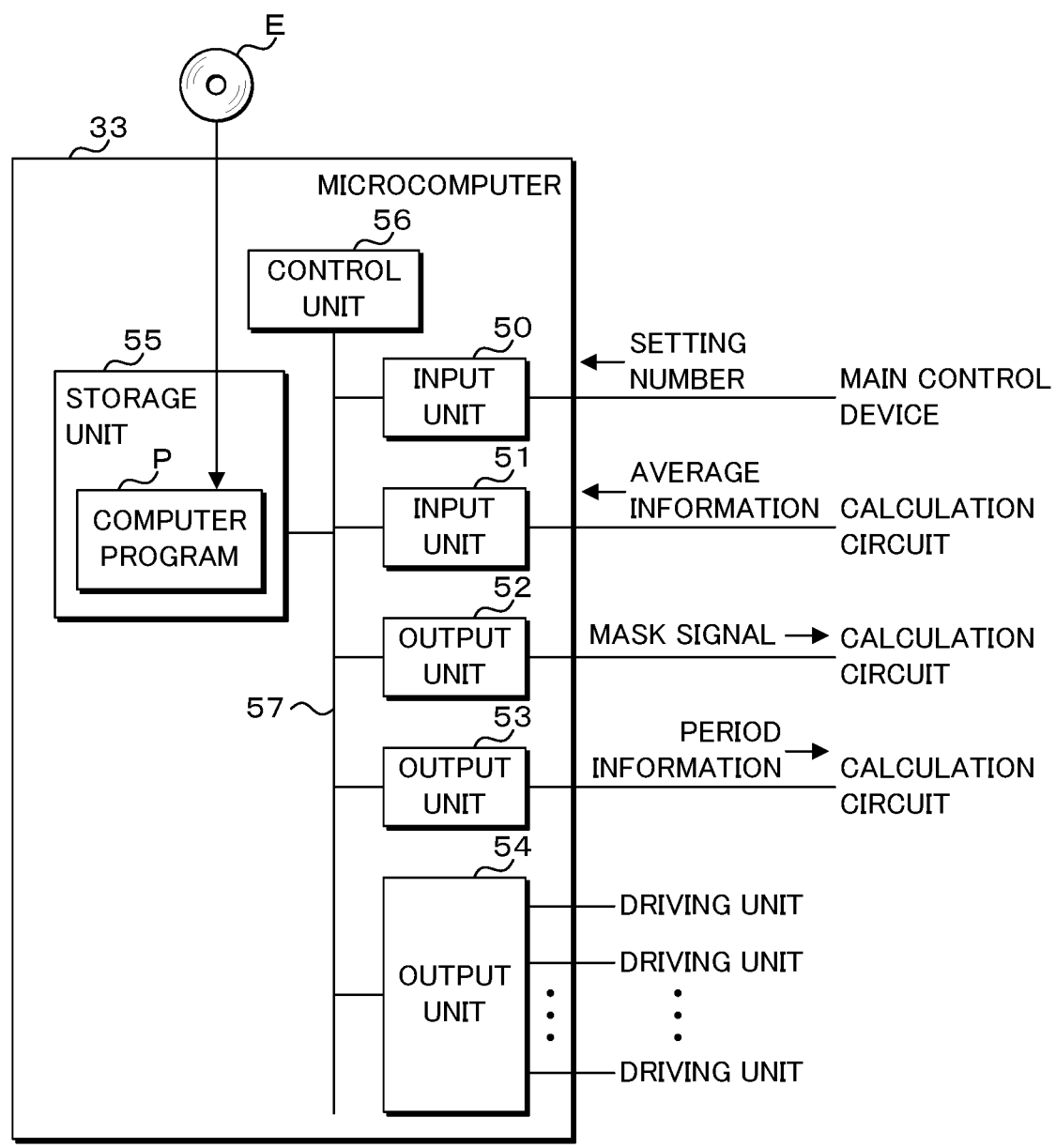
FIG. 6 is a block diagram showing the main configuration of a microcomputer.

FIG. 6 is a block diagram showing the main configuration of the microcomputer 33. The microcomputer 33 includes input units 50 and 51, output units 52, 53, and 54, a storage unit 55, and a control unit 56. These are connected to an internal bus 57. The input unit 50 is also connected to the main control device 16. Each of the input unit 51 and the output unit 52 and 53 is also connected to the calculation circuit 34. The output unit 54 is separately connected to n driving units 42 included in the variable capacitor unit 31.

The setting number is input from the main control device 16 to the input unit 50. When the setting number is input, the input unit 50 notifies the control unit 56 of the input setting number. The average information is input from the calculation circuit 34 to the input unit 51. When the average information is input, the input unit 51 notifies the control unit 56 of the average value of the first load side impedance or of the first reflection coefficient, the average value being indicated by the input average information.

The output unit 52 outputs a mask signal to the calculation circuit 34. The output unit 52 switches the voltage indicated by the mask signal to a high level voltage or a low level voltage according to an instruction from the control unit 56. The output unit 53 outputs period information to the calculation circuit 34 according to an instruction from the control unit 56.

The output unit 54 outputs a high level voltage or a low level voltage to the n driving units 42. The output unit 54 switches each of the output voltages which are to be output to the n driving units 42, to a high level voltage or a low level voltage according to an instruction from the control unit 56. As described above, each driving unit 42 switches the PIN diode 41 on or off according to the output voltage.

The control unit 56 instructs the output unit 54 to switch each of the output voltages which are to be output to the n driving units 42, to high level voltage or low level voltage. Thus, the control unit 56 separately realizes switching of the n PIN diodes 41 included in the variable capacitor unit 31 to ON or OFF. The control unit 56 changes the capacitance value of the variable capacitor unit 31 by switching the n PIN diodes 41 on or off separately. The control unit 56 functions as a capacitance value changing unit.

The storage unit 55 is a non-volatile memory. A computer program P is stored in the storage unit 55. The control unit 56 includes a processor that executes processing. The processor is, for example, a CPU. The processor of the control unit 56 performs a period change process and an adjustment process in parallel by executing the computer program P. In the period change process, the set period and the reference period are changed. In the adjustment process, the first impedance is adjusted.

The computer program P may be stored in a storage medium E so as to be readable by the processor of the control unit 56. In this case, the computer program P read from the storage medium E by a reader (not shown) is written in the storage unit 55 of the microcomputer 33. The storage medium E is an optical disk, a flexible disk, a magnetic disk, a magneto-optical disk, a semiconductor memory, or the like. In addition, the computer program P may be downloaded from an external device (not shown) connected to a communication network (not shown), and the downloaded computer program P may be written in the storage unit 55.

The number of processors included in the control unit 56 may be 2 or more. In this case, a plurality of processors may cooperatively perform the period change process and the adjustment process.

Candidate values for the set period and the reference period are stored in the storage unit 55. Each of the set period and the reference period is associated with the setting number. FIG. 7 is a chart showing candidate values of the set period and the reference period corresponding to the setting number. As shown in FIG. 7, candidate values of the set period and the reference period corresponding to the setting numbers 1, 2, . . . , are stored in the storage unit 55. For each setting number, when the candidate value of the set period is short, the candidate value of the reference period is long. For example, the candidate values of the set period and the reference period in each setting number are adjusted so that the sum of the candidate values becomes a fixed value. The impedance range of the plasma generator 11 can be calculated for each setting number shown in FIG. 2. The candidate value of the set period corresponding to the setting number, for which the value of the impedance range is small, is long.

<Period Change Process>

Figure 8:
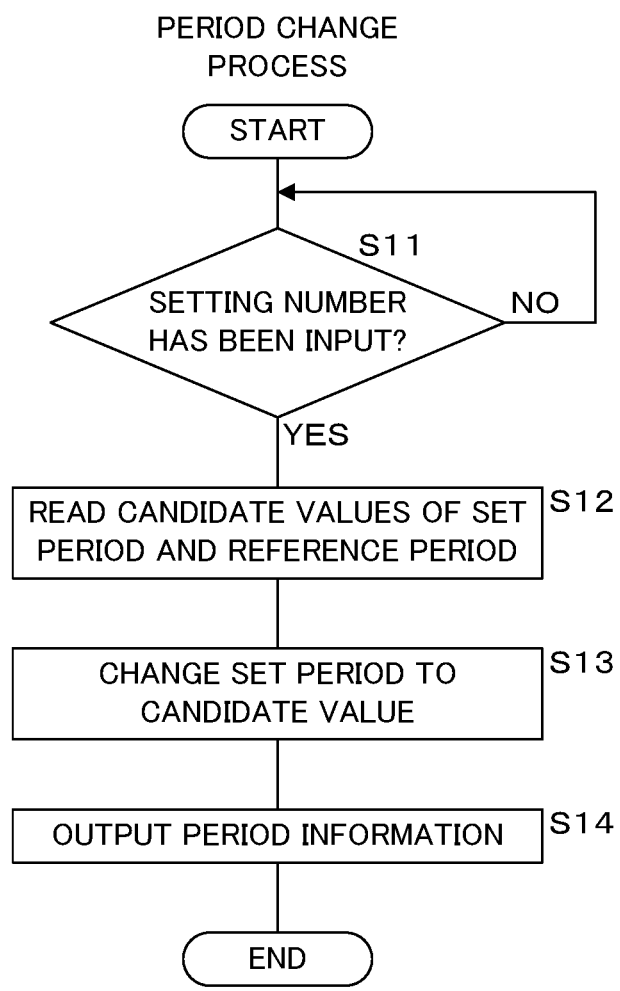
FIG. 8 is a flowchart showing the procedure of a period change process.

FIG. 8 is a flowchart showing the procedure of the period change process. In the period change process, the control unit 56 determines whether or not the setting number has been input to the input unit 50 (step S11). When it is determined that the setting number has not been input (S11: NO), the control unit 56 executes step S11 again and waits until the setting number is input.

When it is determined that the setting number has been input (S11: YES), the control unit 56 reads, from the storage unit 55, candidate values of the set period and the reference period corresponding to the setting number input to the input unit 50 (step S12). The control unit 56 changes the set period to the candidate value of the set period read in step S12 (step S13). Therefore, the set period is a period corresponding to the setting number, that is, the state of the plasma generator 11.

Then, the control unit 56 instructs the output unit 53 to output, to the calculation circuit 34, period information indicating the candidate value of the reference period read in step S12 (step S14). Thus, the calculation circuit 34 changes the reference period to the candidate value of the reference period indicated by the period information input from the output unit 53. Therefore, the reference period is also a period corresponding to the setting number, that is, the state of the plasma generator 11. The calculation circuit 34 also functions as a period changing unit that changes the reference period. After executing step S14, the control unit 56 ends the period change process.

As described above, the longer the candidate value of the set period, the shorter the candidate value of the reference period. Therefore, the longer the set period, the shorter the reference period. In addition, the smaller the value of the impedance range corresponding to the setting number input to the input unit 50, the longer the set period.

The period change process performed by the control unit 56 of the impedance adjustment device 13b is similar to the period change process performed by the control unit 56 of the impedance adjustment device 13a.

<Adjustment Process>

Figure 9:
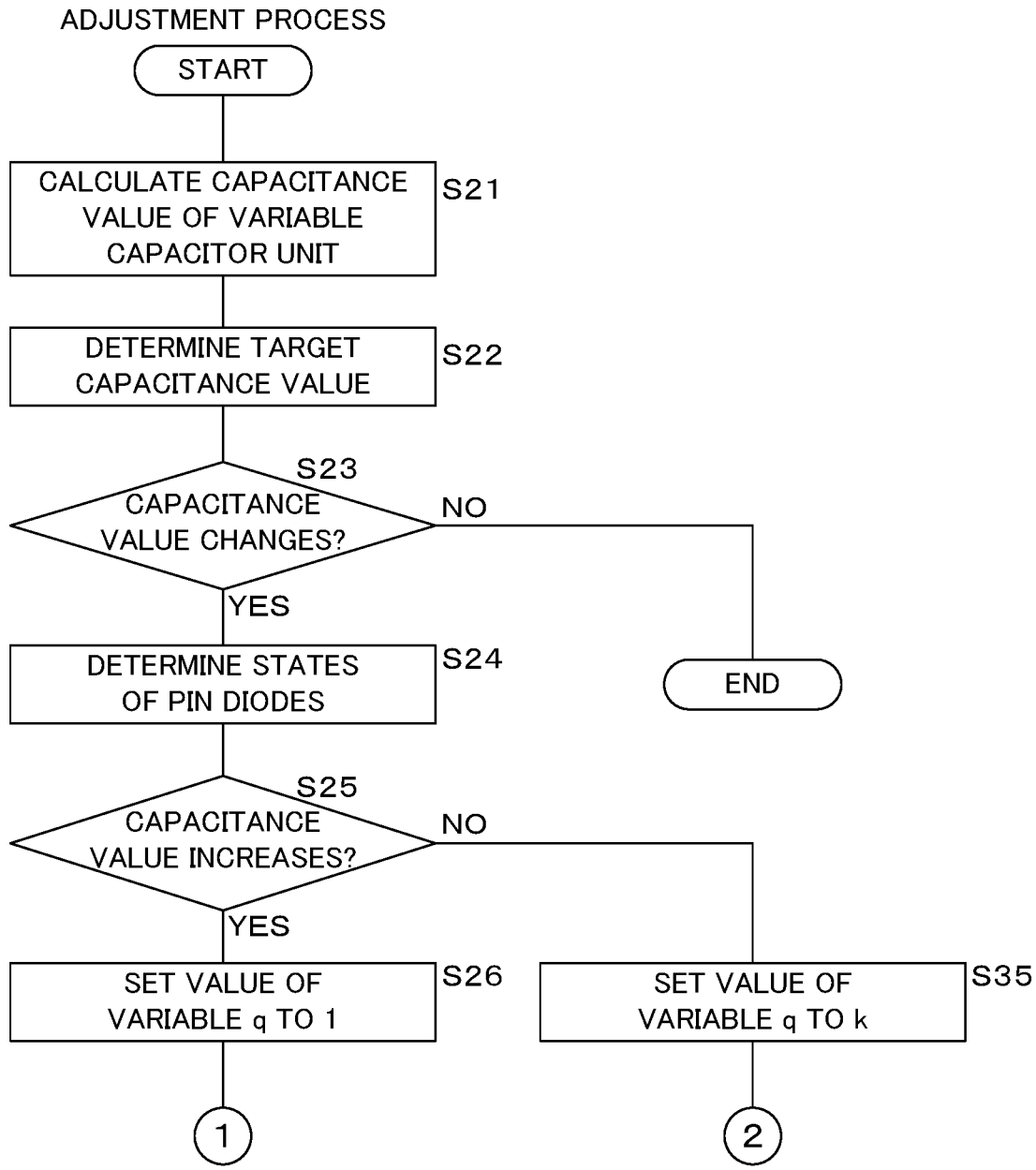
FIG. 9 is a flowchart showing the procedure of an adjustment process.
Figure 10:
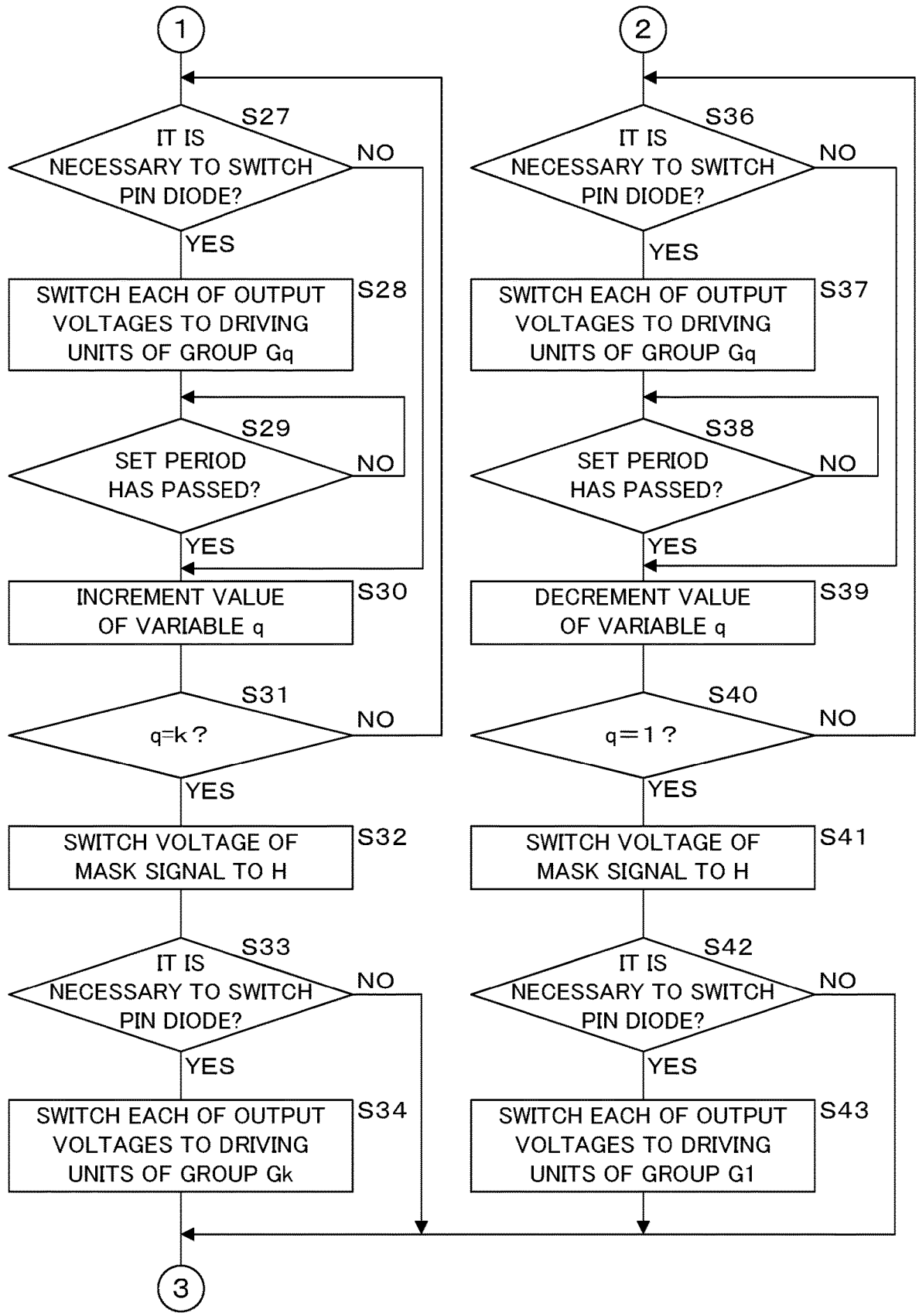
FIG. 10 is a flowchart showing the procedure of the adjustment process.
Figure 11:
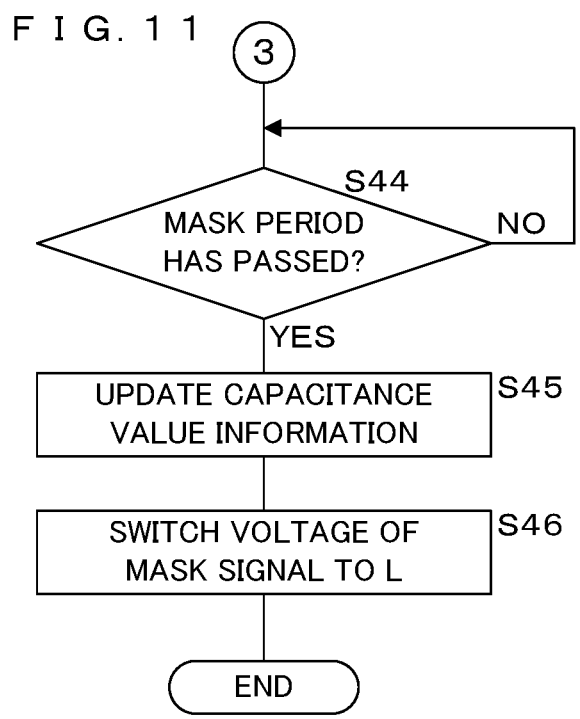
FIG. 11 is a flowchart showing the procedure of the adjustment process.

FIGS. 9, 10, and 11 are flowcharts showing the procedure of the adjustment process. The control unit 56 periodically performs the adjustment process. The storage unit 55 stores: capacitance value information indicating the capacitance value of the variable capacitor unit 31; and the value of a variable q. It is noted that, the capacitance value indicated by the capacitance value information is the whole the capacitance value of the n capacitor circuits A1, A2, . . . , An included in the variable capacitor unit 31. The capacitance value of the variable capacitor unit 31 can be calculated based on the ON/OFF states of the PIN diodes 41. The capacitance value indicated by the capacitance value information is updated by the control unit 56. The value of the variable q is changed by the control unit 56. The value of the variable q is an integer of 1 or more and k or less. As described above, k indicates the number of groups G1, G2, . . . , Gk. In the example of FIG. 4, k is 2. A first load side impedance adjustment process performed when the average information indicates the average value of the first load side impedance will be described below.

In the adjustment process, first, the control unit 56 calculates the capacitance value of the variable capacitor unit 31, at which the first load side impedance matches the complex conjugate of the output impedance of the high frequency power supply 10*a*, based on the average value of the first load side impedance (step S21). Here, the average value of the first load side impedance is an average value indicated by the latest average information input to the input unit 51. This average value is calculated by the calculation circuit 34. Then, the control unit 56 determines a target capacitance value based on the capacitance value calculated in step S21 (step S22). The target capacitance value is a capacitance value that can be realized in the variable capacitor unit 31. The target capacitance value is a capacitance value that matches the capacitance value calculated in step S21 or is closest to the calculated capacitance value. The control unit 56 also functions as a determining unit.

In addition, as described above, the capacitance value indicated by the capacitance value information can be calculated from the ON/OFF states of the n PIN diodes 41 included in the variable capacitor unit 31. That is, as the capacitance value information, information indicating the ON/OFF states of the n PIN diodes 41 included in the variable capacitor unit 31 may be used. Similarly, the target capacitance value can be expressed by the ON/OFF states of the n PIN diodes 41 included in the variable capacitor unit 31.

Then, the control unit 56 determines whether or not the capacitance value of the variable capacitor unit 31 changes when the capacitance value of the variable capacitor unit 31 is changed from the current capacitance value to the target capacitance value determined in step S22 (step S23). The current capacitance value of the variable capacitor unit 31 at the time when step S23 is executed is the capacitance value indicated by the capacitance value information. In step S23, the control unit 56 determines that the capacitance value changes when the target capacitance value determined in step S22 is different from the current capacitance value indicated by the capacitance value information. When the target capacitance value determined in step S22 matches the current capacitance value indicated by the capacitance value information, the control unit 56 determines that the capacitance value does not change.

When the capacitance value of the variable capacitor unit 31 does not change, it is not necessary to change the capacitance value of the variable capacitor unit 31. Therefore, when it is determined that the capacitance value does not change (S23: NO), the control unit 56 ends the adjustment process. When the capacitance value of the variable capacitor unit 31 changes, the capacitance value of the variable capacitor unit 31 is changed to the target capacitance value determined in step S22. Therefore, when it is determined that the capacitance value changes (S23: YES), the control unit 56 determines the states of the n PIN diodes 41 in which the capacitance value of the variable capacitor unit 31 becomes the target capacitance value determined in step S22 (step S24). Specifically, the states of the n PIN diodes 41 shown in FIG. 4 are changed.

Then, the control unit 56 determines whether or not the capacitance value of the variable capacitor unit 31 increases when the capacitance value of the variable capacitor unit 31 is changed to the target capacitance value (step S25). When it is determined that the capacitance value increases (S25: YES), the control unit 56 sets the value of the variable q to 1 (step S26). Then, the control unit 56 determines whether or not it is necessary to switch the PIN diode 41 belonging to the group Gq on or off (step S27). When it is determined that the PIN diode 41 needs to be switched (S27: YES), the control unit 56 switches, to a high level voltage or a low level voltage, each of the output voltages to the driving units 42 of the group Gq (step S28). In step S28, the control unit 56 switches the output voltages to the driving units 42 of the group Gq so that the states of a plurality of PIN diodes 41 belonging to the group Gq become the states of the plurality of PIN diodes 41 determined in step S24.

Thus, among the PIN diodes 41 belonging to the group Gq, all the PIN diodes 41 that need to be switched for the change to the target capacitance value are switched on or off by the driving unit 42. It is assumed that the PIN diode 41 that needs to be switched on or off remains at the end of the execution of step S28. In this case, by executing step S28, the capacitance value of the variable capacitor unit 31 is changed to a relay capacitance value different from the target capacitance value.

Then, the control unit 56 determines whether or not a set period has passed after the execution of step S28 (step S29). As described above, the set period is changed to a period corresponding to the setting number in the period change process. When the microcomputer 33 includes a timer (not shown), the control unit 56 causes the timer to measure the time that has passed after the execution of step S28. In step S29, the control unit 56 determines whether or not the set period has passed based on the time measured by the timer. When it is determined that the set period has not passed (S29: NO), the control unit 56 executes step S29 again and waits until the set period passes. By changing the capacitance value of the variable capacitor unit 31, the state of the plasma generator 11 changes. The set period is longer than the total time of following two periods. One period is the maximum period required to change the capacitance value. The other period is the period required for the state of the plasma generator 11 to stabilize.

That is, immediately after the capacitance value of the variable capacitor unit 31 is changed by switching the PIN diode 41 on or off once, the next capacitance value change is not performed. The control unit 56 waits until the period required for the state of the plasma generator 11 (plasma state) to stabilize passes. After the required period passes, the control unit 56 performs the next capacitance value change. Therefore, a steep impedance change can be suppressed. In this case, in the plasma generator 11, the plasma can follow the impedance change. As a result, it is possible to prevent the plasma state from becoming unstable in the plasma generator 11. In addition, the set period can be set to an appropriate period that matches the process condition based on the results of experiments or simulations. The process conditions are various conditions, each of which is represented by the values of AC powers to be output from the high frequency power supplies 10*a* and 10*b*, the gas flow rate, or the like.

When it is determined that the switching of the PIN diode 41 belonging to the group Gq is not necessary (S27: NO) or it is determined that the set period has passed (S29: YES), the control unit 56 increments the value of the variable q by 1 (step S30). Then, the control unit 56 determines whether or not the value of the variable q is k (step S31). As described above, k is the number of groups G1, G2, . . . , Gk.

When it is determined that the value of the variable q is not k (S31: NO), the control unit 56 executes step S27 again. If necessary, the control unit 56 changes the capacitance value of the variable capacitor unit 31 again. Thus, the control unit 56 switches the output voltages to the plurality of driving units 42 sequentially for the groups of the group G1 to the group Gk−1. The switchings of the output voltages to the plurality of driving units 42 are the switchings of the plurality of PIN diodes 41. When it is determined that the value of the variable q is k (S31: YES), the control unit 56 instructs the output unit 52 to switch, to a high level voltage, the voltage of the mask signal output to the calculation circuit 34 (step S32). Thus, the calculation circuit 34 stops the calculation of the first load side impedance.

Then, the control unit 56 determines whether or not it is necessary to switch the PIN diode 41 belonging to the group Gk on or off (step S33). When it is determined that the PIN diode 41 needs to be switched (S33: YES), the control unit 56 switches, to a high level voltage or a low level voltage, each of the output voltages to the driving units 42 of the group Gk (step S34). In step S34, the control unit 56 switches the output voltages to the driving units 42 of the group Gk so that the states of a plurality of PIN diodes 41 belonging to the group Gk become the states of the plurality of PIN diodes 41 determined in step S24. When the PIN diodes 41 belonging to the group Gk include the PIN diode 41 that needs to be switched, the capacitance value of the variable capacitor unit 31 is changed to the target capacitance value by executing step S34.

As described above, as the number of the group increases, the value of the capacitance value range of the group increases. It is assumed that the capacitance value of the variable capacitor unit 31 is increased by changing the capacitance value to the target capacitance value. In this case, the control unit 56 switches on or off all the PIN diodes 41 that need to be switched for the change to the target capacitance value among the PIN diodes 41 belonging to a group, for which the value of the capacitance value range is the smallest, among a plurality of groups, each group including the PIN diode 41 that needs to be switched on or off. Thus, the capacitance value of the variable capacitor unit 31 is changed to the relay capacitance value. ON/OFF Switching is performed from one or more PIN diodes 41 belonging to the group for which the value of the capacitance value range is the smallest. Therefore, the relay capacitance value does not exceed the target capacitance value. This switching is effective in a configuration in which the operation of the plasma generator 11 is unstable when the capacitance value of the variable capacitor unit 31 is large.

When it is determined that the capacitance value does not increase (S25: NO), the control unit 56 sets the value of the variable q to k (step S35). The fact that the capacitance value does not increase means that the capacitance value decreases. Then, the control unit 56 determines whether or not it is necessary to switch the PIN diode 41 belonging to the group Gq on or off (step S36). When it is determined that the PIN diode 41 needs to be switched (S36: YES), the control unit 56 switches, to a high level voltage or a low level voltage, each of the output voltages to the driving units 42 of the group Gq in the similar manner as in step S28 (step S37).

Then, as in step S29, the control unit 56 determines whether or not the set period has passed after the execution of step S37 (step S38). When it is determined that the set period has not passed (S38: NO), the control unit 56 executes step S38 again and waits until the set period passes, that is, until the plasma state stabilizes. The set period in step S38 plays the similar role as in step S29.

When it is determined that the switching of the PIN diode 41 belonging to the group Gq is not necessary (S36: NO) or when it is determined that the set period has passed (S38: YES), the control unit 56 decrements the value of the variable q by 1 (step S39). Then, the control unit 56 determines whether or not the value of the variable q is 1 (step S40).

When it is determined that the value of the variable q is not 1 (S40: NO), the control unit 56 executes step S36 again. If necessary, the control unit 56 changes the capacitance value of the variable capacitor unit 31 again. Thus, the control unit 56 switches the output voltages to the plurality of driving units 42 sequentially for the groups of the group Gk to the group G2. The switchings of the output voltages to the plurality of driving units 42 are the switchings of the plurality of PIN diodes 41. When it is determined that the value of the variable q is 1 (S40: YES), the control unit 56 instructs the output unit 52 to switch, to a high level voltage, the voltage of the mask signal output to the calculation circuit 34 (step S41). Thus, the calculation circuit 34 stops the calculation of the first load side impedance.

Then, the control unit 56 determines whether or not it is necessary to switch the PIN diode 41 belonging to the group G1 on or off (step S42). When it is determined that the PIN diode 41 needs to be switched (S42: YES), the control unit 56 switches, to a high level voltage or a low level voltage, each of the output voltages to the driving unit 42 of the group G1 (step S43). In step S43, the control unit 56 switches the output voltages to the driving units 42 of the group G1 so that the states of a plurality of PIN diodes 41 belonging to the group G1 become the states of the plurality of PIN diodes 41 determined in step S24. When the PIN diodes 41 belonging to the group G1 include the PIN diode 41 that needs to be switched, the capacitance value of the variable capacitor unit 31 is changed to the target capacitance value by executing step S43.

It is assumed that the capacitance value of the variable capacitor unit 31 is decreased by changing the capacitance value to the target capacitance value. In this case, the control unit 56 switches all the PIN diodes 41 that need to be switched for the change to the target capacitance value among the PIN diodes 41 belonging to a group, for which the value of the capacitance value range is the largest, among a plurality of groups, each group including the PIN diodes 41 that need to be switched on or off. Thus, the capacitance value of the variable capacitor unit 31 is changed from the current capacitance value to the relay capacitance value. ON/OFF Switching is performed from one or more PIN diodes 41 belonging to the group for which the value of the capacitance value range is the largest. Therefore, the relay capacitance value does not greatly exceed the target capacitance value. This switching is effective in a configuration in which the operation of the plasma generator 11 is unstable when the capacitance value of the variable capacitor unit 31 is large.

When it is determined that the switching of the PIN diode 41 belonging to the group Gk is not necessary (S33: NO), when it is determined that the switching of the PIN diode 41 belonging to the group G1 is not necessary (S42: NO), or after executing step S34 or step S43, the control unit 56 determines whether or not a mask period has passed after the execution of step S32 or step S41 (step S44). The mask period is a fixed value, and is set in advance. When the microcomputer 33 includes a timer, the control unit 56 causes the timer to measure the time that has passed after the execution of step S32 or step S41. In step S44, the control unit 56 determines whether or not the mask period has passed based on the time measured by the timer. When it is determined that the mask period has not passed (S44: NO), the control unit 56 executes step S44 again and waits until the mask period passes. By changing the capacitance value of the variable capacitor unit 31, the first load side impedance changes. The mask period is longer than the total time of following two periods. One period is the maximum period required to change the capacitance value in step S34 or step S43. The other period is the period required for the first load side impedance to stabilize.

When it is determined that the mask period has passed (S44: YES), the control unit 56 updates the capacitance value indicated by the capacitance value information to the target capacitance value determined in step S22 (step S45). Then, the control unit 56 instructs the output unit 52 to switch, to a low level voltage, the voltage of the mask signal output to the calculation circuit 34 (step S46). Thus, the calculation circuit 34 restarts the calculation of the first load side impedance and the average value. After executing step S46, the control unit 56 ends the adjustment process.

A first reflection coefficient adjustment process performed when the average information indicates the average value of the first reflection coefficient is similar to the first load side impedance adjustment process except for the following points. In step S21 of the first reflection coefficient adjustment process, the control unit 56 calculates the capacitance value of the variable capacitor unit 31, at which the first reflection coefficient becomes 0, based on the average value of the first reflection coefficient indicated by the average information input to the input unit 51. When the control unit 56 executes step S32 or step S41, the calculation circuit 34 stops the calculation of the first reflection coefficient. When the control unit 56 executes step S46, the calculation circuit 34 restarts the calculation of the first reflection coefficient.

The control unit 56 of the impedance adjustment device 13b performs a second load side impedance adjustment process (or a second reflection coefficient adjustment process). The second load side impedance adjustment process (or the second reflection coefficient adjustment process) is similar to the first load side impedance adjustment process (or the first reflection coefficient adjustment process) performed by the control unit 56 of the impedance adjustment device 13a.

<Operation of Impedance Adjustment Device 13a>

Figure 12:
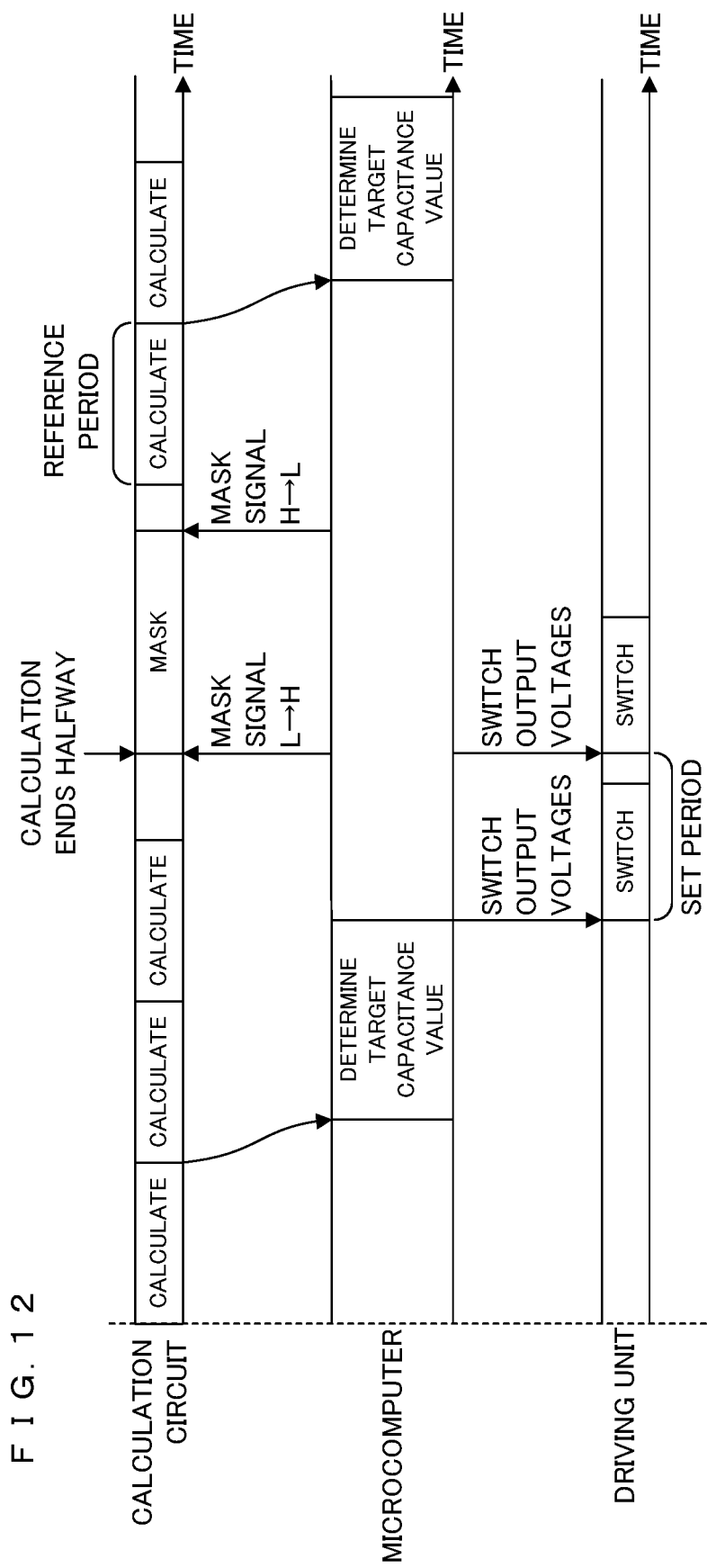
FIG. 12 is a timing chart for describing the operation of an impedance adjustment device.

FIG. 12 is a timing chart for describing the operation of the impedance adjustment device 13a. The processes performed by the calculation circuit 34, the microcomputer 33, and the driving unit 42 are shown in chronological order. Here, an example will be described in which the number of groups is 2 and the driving units 42 belonging to the groups G1 and G2 switch the PIN diodes 41 on or off. The number of groups is expressed by k.

As shown in FIG. 12, the calculation circuit 34 repeatedly calculates the first load side impedance or the first reflection coefficient during the reference period. The calculation circuit 34 calculates an average value of a plurality of first load side impedances or of a plurality of first reflection coefficients calculated during the reference period. The calculation circuit 34 repeatedly performs the series of calculations except for following two periods. One period is a period during which the voltage of the mask signal is a high level voltage. The other period is a period until the waiting time passes after the switching of the voltage of the mask signal to the low level voltage. The calculation circuit 34 outputs, to the microcomputer 33, average information indicating the average value of the first load side impedance or of the first reflection coefficient each time a series of calculations ends.

The microcomputer 33 calculates the capacitance value of the variable capacitor unit 31 based on the average value of the first load side impedance or of the first reflection coefficient indicated by the latest average information input from the calculation circuit 34. Here, the calculated capacitance value is the capacitance value of the variable capacitor unit 31 realizing that the first load side impedance matches the complex conjugate of the output impedance of the high frequency power supply 10a. The microcomputer 33 determines a target capacitance value based on the calculated capacitance value.

It is assumed that the capacitance value of the variable capacitor unit 31 is increased by changing the capacitance value to the target capacitance value. In this case, the microcomputer 33 switches on or off all the PIN diodes 41 that need to be switched for the change to the target capacitance value among the PIN diodes 41 belonging to the group G1 for which the value of the capacitance value range is small. Thus, the capacitance value of the variable capacitor unit 31 is changed to the relay capacitance value. Specifically, the microcomputer 33 causes the driving units 42 to switch the PIN diodes 41 by switching the output voltages to the driving units 42. After the set period passes after the change of the capacitance value to the relay capacitance value, the microcomputer 33 switches on or off all the PIN diodes 41 that need to be switched for the change to the target capacitance value among the PIN diodes 41 belonging to the group G2. Thus, the capacitance value of the variable capacitor unit 31 is changed to the target capacitance value. The value of the capacitance value range of the group G2 is larger than that of the group G1.

It is assumed that the capacitance value of the variable capacitor unit 31 is decreased by changing the capacitance value to the target capacitance value. In this case, the microcomputer 33 switches on or off all the PIN diodes 41 that need to be switched for the change to the target capacitance value among the PIN diodes 41 belonging to the group G2 for which the value of the capacitance value range is large. Then, after the set period passes after the change of the capacitance value to the relay capacitance value, the microcomputer 33 switches on or off all the PIN diodes 41 that need to be switched for the change to the target capacitance value among the PIN diodes 41 belonging to the group G1. The value of the capacitance value range of the group G1 is smaller than that of the group G2.

The microcomputer 33 switches on or off the PIN diodes 41 belonging to the last group relevant to the change of the capacitance value of the variable capacitor unit 31, and switches the voltage of the mask signal from the low level voltage to the high level voltage. After the mask period passes after the switching of the voltage of the mask signal to the high level voltage, the microcomputer 33 returns the voltage of the mask signal voltage to the low level voltage. After the waiting time passes after the returning of the voltage of the mask signal to the low level voltage, the calculation circuit 34 repeats the series of calculations again.

As described above, when the capacitance value of the variable capacitor unit 31 is changed to the target capacitance value, the microcomputer 33 switches on or off all the PIN diodes 41 that need to be switched for the change to the target capacitance value among the PIN diodes 41 belonging to the group G1 or the group G2. Thus, the microcomputer 33 temporarily changes the capacitance value of the variable capacitor unit 31 to the relay capacitance value. Thereafter, the microcomputer 33 switches on or off all the PIN diodes 41 that need to be switched for the change to the target capacitance value among the PIN diodes 41 belonging to the remaining group.

It is assumed that a plurality of PIN diodes 41 are switched on or off in a common time zone. When the plurality of PIN diodes 41 that are switched on or off include: the PIN diode 41 that is switched on; and the PIN diode 41 that is switched off, the capacitance value of the variable capacitor unit 31 exceeds the target capacitance value. In the impedance adjustment device 13a in which grouping is performed as shown in FIG. 4, the relay capacitance value is a capacitance value between the current capacitance value and the target capacitance value. It is assumed that the capacitor circuits A1, A2, A3, and A4 belonging to the group G1 include: the PIN diode 41 that is switched on in the common time zone; and the PIN diode 41 that is switched off in the common time zone. Even in this case, the possibility that the capacitance value of the variable capacitor unit 31 will exceed the target capacitance value in the transition period until the capacitance value of the variable capacitor unit 31 becomes the relay capacitance value from the current capacitance value is very low.

In addition, the capacitance value is changed to the target capacitance value from the state in which the capacitance value has already been changed to the relay capacitance value. It is assumed that the capacitance value of the variable capacitor unit 31 exceeds the target capacitance value. Even in this case, the amount of excess is smaller than that when the capacitance values of all the capacitor circuits A1 to A8 are changed in a common time zone. Therefore, the change in the reflection coefficient is smaller than the conventional change in the reflection coefficient. For this reason, for example, a possibility that the state of plasma generated by the plasma generator 11 will be prevented from being fixed to an unstable state is high.

The period required for the driving units 42 belonging to one group to switch the PIN diode 41 on or off is almost the same. Therefore, as the set period becomes longer, the period required until the next capacitance value change starts after the capacitance value of the variable capacitor unit 31 is changed to the relay capacitance value becomes longer. As described above, in the chamber 20 of the plasma generator 11, a plurality of processes using plasma are sequentially performed. Therefore, the state of the plasma generator 11 changes with the passage of time. The period required for the state of the plasma generator 11 to stabilize after the capacitance value of the variable capacitor unit 31 is changed to the relay capacitance value differs depending on the state of the plasma generator 11. The set period is changed according to the state of the plasma generator 11. Therefore, the next capacitance value change can be started immediately after the state of the plasma generator 11 is stabilized. As a result, the next capacitance value change is not performed in a state in which the state of the plasma generator 11 is unstable.

The microcomputer 33 periodically determines the target capacitance value. As the set period becomes longer, the timing at which the calculation circuit 34 starts calculating the first load side impedance or the first reflection coefficient after the voltage of the mask signal is switched to the low level voltage becomes later. However, when the set period is long, the reference period is short. For this reason, the microcomputer 33 can determine the next target capacitance value based on the average value of the first load side impedance or of the first reflection coefficient calculated by the calculation circuit 34 after the capacitance value of the variable capacitor unit 31 is changed to the current target capacitance value.

It is assumed that the set period is long. In this case, in a configuration in which the reference period is fixed, the microcomputer 33 may determine the next target capacitance value based on the average value of the first load side impedance or of the first reflection coefficient calculated by the calculation circuit 34 before the capacitance value of the variable capacitor unit 31 is changed to the current target capacitance value.

The operation of the impedance adjustment device 13b is similar to the operation of the impedance adjustment device 13a. The impedance adjustment device 13b achieves similar effects of the impedance adjustment device 13a.

Modification Examples

The period that changes according to the state of the plasma generator 11 is not limited to the reference period and the set period. For example, the mask period may be changed according to the state of the plasma generator 11. Similarly to the reference period, the mask period is changed to a short period when the set period is long. The mask period may be changed according to the state of the plasma generator 11 in a state in which the reference period is fixed. In addition, when the cycle relevant to the determination of the target capacitance value is sufficiently long, the reference period and the mask period may be fixed.

In the present embodiment, the number of high frequency power supplies included in the plasma apparatus 1 is not limited to two. The number of high frequency power supplies may be one. The plasma apparatus 1 may not include one of the high frequency power supplies 10a and 10b. When the plasma apparatus 1 includes only the high frequency power supply 10a, the electrode 21b is grounded. When the plasma apparatus 1 includes only the high frequency power supply 10b, only the DC power supply 15 is connected to the electrode 21a. The type of the plasma generator 11 is not limited to the capacitive coupling type. The type of the plasma generator 11 may be, for example, an inductive coupling type. In this case, the plasma generator 11 includes an inductor instead of the electrodes 21a and 21b. The plasma generator 11 includes a tubular chamber instead of the box-shaped chamber 20. The inductor is wound around the outer surface of the chamber. For example, in a state in which gas has been injected into the chamber and one end of the inductor is grounded, the high frequency power supply 10a applies a high frequency AC voltage to the other end of the inductor through the high frequency detector 12a and the impedance adjustment device 13a. Thus, plasma is generated in the chamber. In this configuration, the inductor functions as an application body.

In each of the impedance adjustment devices 13a and 13b according to the present embodiment, the process performed by the calculation circuit 34 may be performed by the control unit 56 of the microcomputer 33. In this case, two pieces of parameter information are output from the high frequency detectors 12a and 12b to the microcomputers 33 of the impedance adjustment devices 13a and 13b, respectively. In the present embodiment, there is no problem as long as the PIN diode 41 function as a semiconductor switch. Therefore, a field effect transistor (FET), a bipolar transistor, a thyristor, or the like may be used instead of the PIN diode 41. The load to which each of the high frequency power supplies 10a and 10b outputs an AC voltage is not limited to the plasma generator 11, and may be, for example, a non-contact power transmission device. In addition, the capacitance value of the capacitor 40 of each of the capacitor circuits A1, A2, . . . , An may be the same as the capacitance value of the capacitor 40 of another capacitor circuit.

It is noted that, as used herein and in the appended claims, the singular forms "a", "an", and "the" include plural referents unless the context clearly dictates otherwise.

It should be considered that the present embodiment disclosed is an example in all points and not restrictive. The scope of the invention is defined by the claims rather than the meanings set forth above, and is intended to include all modifications within the scope and meaning equivalent to the claims

What is claimed is:

1. An impedance adjustment device that is to be disposed in midway of a transmission line of an AC voltage output from an AC power supply to a load and that adjusts an impedance when viewed from the AC power supply, comprising:
    a variable capacitor unit including a plurality of capacitors and a plurality of semiconductor switches; and
    a processor,
    wherein, in the variable capacitor unit, a plurality of capacitor circuits are connected in parallel,
    the plurality of capacitor circuits are divided into a plurality of groups,
    in each capacitor circuit, the capacitor is connected in series to the semiconductor switch,
    the processor determines a target capacitance value of a capacitance value of the variable capacitor unit,
    the processor determines an on or off state of the semiconductor switch of each of the capacitor circuits based on a determined target capacitance value,
    the processor performs in an order, for each of the groups, processing of determining whether or not the state of the semiconductor switch of the capacitor circuits divided into groups needs to be changed, and processing of changing the on or off state of the semiconductor switch of the capacitor circuits in a group determined that the state of the semiconductor switch needs to be changed, and
    the processor does not determine, in a case where a group with a changed on or off state of the semiconductor switch of the capacitor circuit is not a last group in the order, whether or not the semiconductor switch of a subsequent group needs to be changed until a predetermined first time period passes after the on or off state of the semiconductor switch in the group is changed.

2. The impedance adjustment device according to claim 1, wherein the predetermined first time period is set according to a process condition of a process performed in the load.

3. The impedance adjustment device according to claim 1, wherein the processor does not perform, in a case where a group with a changed on or off state of the semiconductor switch of the capacitor circuit is the last group in the order, processing of determining the target capacitance value of the variable capacitor unit until a predetermined second time period passes.

4. The impedance adjustment device according to claim 1, wherein the plurality of groups are placed in an order from a group with a smallest total value of the capacitance value of the capacitor in the group, and
the processor determines, in the case where the capacitance value of the variable capacitor is increased, whether or not the semiconductor switch of the capacitor circuit needs to be changed in an order from a group with the smallest total value of the capacitance value of the capacitor.

5. The impedance adjustment device according to claim 1, wherein the plurality of groups are placed in order from a group with a smallest total value of the capacitance value of the capacitor in the group, and
the processor determines, in a case where the capacitance value of the variable capacitor is decreased, whether or not the semiconductor switch of the capacitor circuit needs to be changed in an order from a group with a largest total value of the capacitance value of the capacitor.

6. The impedance adjustment device according to claim 1, wherein each of the capacitors in the groups of the capacitor circuits divided into the plurality of groups has a different capacitance value.

\* \* \* \* \*